(12) United States Patent
Paul et al.

(10) Patent No.: US 12,060,751 B2
(45) Date of Patent: Aug. 13, 2024

(54) COATED GLASS PANE

(71) Applicant: PILKINGTON GROUP LIMITED, Lathom (GB)

(72) Inventors: Thomas Paul, Herne (DE); Axel Nöthe, Castrop-Rauxel (DE); Tobias Breil, Dorsten (DE)

(73) Assignee: Pilkington Group Limited, Lathom (GB)

( * ) Notice: Subject to any disclaimer, the term of this patent is extended or adjusted under 35 U.S.C. 154(b) by 214 days.

(21) Appl. No.: 17/298,744

(22) PCT Filed: Dec. 9, 2019

(86) PCT No.: PCT/GB2019/053468
§ 371 (c)(1),
(2) Date: Jun. 1, 2021

(87) PCT Pub. No.: WO2020/115507
PCT Pub. Date: Jun. 11, 2020

(65) Prior Publication Data
US 2022/0034155 A1     Feb. 3, 2022

(30) Foreign Application Priority Data

Dec. 7, 2018 (GB) ...................................... 1820002

(51) Int. Cl.
*C03C 17/36* (2006.01)
*C23C 14/00* (2006.01)
(Continued)

(52) U.S. Cl.
CPC ............ *E06B 9/24* (2013.01); *C03C 17/3644* (2013.01); *C03C 17/3649* (2013.01);
(Continued)

(58) Field of Classification Search
CPC .............. C03C 17/366; C03C 17/3644; C03C 17/3681; B32B 17/1022; B32B 17/10229;
(Continued)

(56) References Cited

U.S. PATENT DOCUMENTS 4,859,532 A * 8/1989 Oyama ................... C23C 14/18
428/472
5,595,825 A * 1/1997 Guiselin ............. C03C 17/3681
428/428

(Continued)

FOREIGN PATENT DOCUMENTS

CN          102372447 B     5/2014
WO     WO/2004063111 A1     7/2004
(Continued)

OTHER PUBLICATIONS

U.K. Intellectual Property Office, GB Search Report issued in GB1820002.2, May 9, 2019, 2 pages, U.K. Intellectual Property Office, Newport, South Wales.

(Continued)

*Primary Examiner* — Z. Jim Yang
(74) *Attorney, Agent, or Firm* — Marshall & Melhorn, LLC

(57) ABSTRACT

The present invention relates to a transparent substrate comprising a multiple layer coating stack and the use of same in the manufacture of a double glazing unit, wherein the multiple layer coating stack comprises, n functional metal layer, m; and n plus 1 (n+1) dielectric layer, d, wherein the dielectric layers are positioned before and after each functional metal layer, and wherein n is the total number of functional metal layer in the stack counted from the substrate and is greater than or equal to 3; and wherein each dielectric layer comprises one or more layers, characterized in that the geometrical layer thickness of each functional metal layer in the coating stack Gm, is greater than the (Continued)

geometrical layer thickness of each functional metal layer appearing before it in the multiple layer coating stack, that is, $Gm_{i+1} > Gm_i$ wherein i is the position of the functional metal layer in the coating stack counted from the substrate, and wherein for each dielectric layer d located before and after each functional metal layer m, the optical layer thickness of each dielectric layer ($opl_n$) is greater than or equal to the optical layer thickness of the dielectric layer ($opl_{n-1}$) positioned before it in the coating stack with the proviso that: twice the optical layer thickness of the first dielectric layer ($opl_1$) in the coating stack, is less than the optical layer thickness of the second dielectric layer ($opl_2$) in the coating stack, that is, $(2 \times opl_1) < opl_2$; and twice the optical layer thickness of the last dielectric layer ($opl_{n+1}$) in the coating stack, is greater than the thickness of the optical layer thickness of the penultimate dielectric layer ($opl_n$), that is, $(opl_n) < (opl_{n+1}) \times 2$.

23 Claims, 3 Drawing Sheets

(51) Int. Cl.
  *C23C 14/35* (2006.01)
  *E06B 3/67* (2006.01)
  *E06B 9/24* (2006.01)
  *G02B 5/20* (2006.01)

(52) U.S. Cl.
  CPC ........ *C03C 17/366* (2013.01); *C03C 17/3681* (2013.01); *C23C 14/0036* (2013.01); *C23C 14/35* (2013.01); *E06B 3/6715* (2013.01); *G02B 5/208* (2013.01); *C03C 2217/212* (2013.01); *C03C 2217/216* (2013.01); *C03C 2217/228* (2013.01); *C03C 2217/24* (2013.01); *C03C 2217/256* (2013.01); *C03C 2217/261* (2013.01); *C03C 2218/155* (2013.01); *C03C 2218/156* (2013.01); *E06B 2009/2417* (2013.01)

(58) Field of Classification Search
  CPC ........ G02B 5/208; G02B 5/281; G02B 5/282; G02B 5/285
  See application file for complete search history.

(56) References Cited

U.S. PATENT DOCUMENTS

| | | | |
|---|---|---|---|
| 6,994,910 B2 | 2/2006 | Stachowiak | |
| 7,713,633 B2 | 5/2010 | Lingle et al. | |
| 7,931,971 B2 | 4/2011 | Lingle et al. | |
| 8,298,678 B2 | 10/2012 | Ingle et al. | |
| 9,482,799 B2 | 11/2016 | Hevesi | |
| 10,025,010 B2 | 7/2018 | Hevesi et al. | |
| 10,539,726 B2 | 1/2020 | Wagner et al. | |
| 10,745,318 B2 | 8/2020 | Lorenzzi et al. | |
| 10,843,962 B2 | 11/2020 | Lorenzzi et al. | |
| 2004/0009356 A1* | 1/2004 | Medwick | C03C 17/3613 428/432 |
| 2005/0205416 A1 | 9/2005 | Stachowiak | |
| 2006/0055308 A1* | 3/2006 | Lairson | H01J 11/44 313/582 |
| 2007/0082186 A1* | 4/2007 | Hartig | C03C 17/366 428/216 |
| 2007/0116967 A1* | 5/2007 | Medwick | C03C 17/3681 428/432 |
| 2007/0242359 A1* | 10/2007 | Thielsch | G02B 5/284 359/585 |
| 2011/0268941 A1* | 11/2011 | Fischer | G02B 5/282 204/192.1 |
| 2012/0177900 A1 | 7/2012 | Laurent et al. | |
| 2013/0057951 A1* | 3/2013 | Hevesi | C03C 17/36 359/359 |
| 2013/0059137 A1* | 3/2013 | Hevesi | G02B 5/208 428/213 |
| 2014/0319116 A1* | 10/2014 | Fischer | C03C 17/3673 219/203 |
| 2014/0347722 A1* | 11/2014 | Hevesi | C03C 17/3639 359/359 |
| 2015/0004383 A1* | 1/2015 | Sandre-Chardonnal | C03C 17/3678 428/213 |
| 2016/0023942 A1* | 1/2016 | Mahieu | C03C 17/3639 428/433 |
| 2016/0122238 A1* | 5/2016 | Roquiny | C03C 17/366 204/192.15 |
| 2016/0124119 A1* | 5/2016 | Georges | C03C 17/3644 359/585 |
| 2018/0194675 A1* | 7/2018 | Lorenzzi | B32B 7/023 |
| 2018/0194676 A1* | 7/2018 | Lorenzzi | B32B 17/10045 |
| 2018/0297890 A1* | 10/2018 | Ding | C03C 17/3602 |
| 2019/0252086 A1* | 8/2019 | Kato | G21F 1/125 |
| 2020/0116910 A1 | 4/2020 | Wagner et al. | |
| 2021/0107258 A1* | 4/2021 | Horie | B32B 15/01 |
| 2021/0395138 A1* | 12/2021 | Jacquet | C03C 17/3626 |

FOREIGN PATENT DOCUMENTS

| | | | |
|---|---|---|---|
| WO | WO/2009145864 A1 | 12/2009 | |
| WO | WO/2011020974 A1 | 2/2011 | |
| WO | WO-2017006027 A1 * | 1/2017 | ....... B32B 17/10036 |
| WO | WO/2017006029 A1 | 1/2017 | |

OTHER PUBLICATIONS

European Patent Office, International Search Report with Written Opinion, issued in PCT/GB2019/053468, Feb. 20, 2020, 9 pages, European Patent Office, Rijswijk, Netherlands.

* cited by examiner

COATED GLASS PANE

BACKGROUND OF THE INVENTION

The present invention relates to a substrate with a coating, more specifically the present invention relates to a transparent substrate with a coating wherein said coating comprises multiple layers, some of which comprise functional layers which reflect solar radiation and/or infrared radiation.

Transparent substrates comprising for example glass, may be provided with coatings to decrease the emissivity ("low-e coating") of the substrate and to achieve thermal insulation properties when the substrate is installed in for example a building, by reflecting the infrared radiation emitted by for instance the interior of a building, and/or to reduce its solar energy transmittance ("solar control coating") to shield interior rooms against the entry of excessive amounts of solar energy (heat).

Coatings which provide such low-emissivity (low-e) and/or solar control when applied to glass substrates may be deposited for example by physical vapour deposition processes, such as, sputtering. Sputtered low-emissivity and solar control coating stacks are commonly comprised of repeat sequences such as for example:

'substrate base dielectric layer sequence$_a$/silver (Ag) dielectric layer sequence$_b$', wherein each of the dielectric sequences a and b do not necessarily comprise the same thickness or composition.

In layer systems of this type, the silver layer serves mainly as an infrared (IR) reflection layer, whilst the dielectric layer ("DL") layers may be employed, through suitable selection of material and thickness, to influence the transmission and reflection properties in the visible region of the spectrum, as well as the energy emitted as thermal energy, that is the emissivity and solar energy transmittance of the coated glass substrate.

Reflections detrimentally affect the view through glass substrates. This problem is particularly significant for applications where a clear view through the glass substrate is crucial to their function.

In addition, there is a continual demand from the glass manufacturing industry for coated glass substrates which meet the demanding performance requirements of automotive and architectural glazing in terms of thermal insulation properties and desired low emissivity, with the result that, ever more complicated layer sequences (or stacks) are used to coat glass substrates based on a range of dielectric materials. Consequently, it is becoming more common in the glass manufacturing industry for the number of dielectric sequences in a coated substrate to be 2 or even 3.

For example, in WO 2011/020974 there is described a transparent glass substrate provided with a thin-film multilayer structure comprising an alternating array of at least three metallic functional layers and four antireflection coatings located on either side of the metallic functional layers, the antireflection coatings also comprising multiple layers.

In U.S. Pat. No. 5,595,825 there is disclosed a substrate coated with a film stack comprising at least three films having reflection properties in the infrared (IR) portion of the spectrum and which has high selectivity, that is, a high light transmission $T_L$ to solar factor (SF) ratio, ($T_L$/SF), for a given value of $T_L$.

US 2013/0057951 describes a layer system with n-functional layers based on for example silver and n+1 dielectric layers. Of significant importance is an absorbing layer located within the stack.

US 2017/0059753 also describes a film with multiple metal functional layers (for example silver) with at least one absorptive layer. The functional layers are surrounded by phase adjustment layers (dielectric layers).

CN 102372447 discloses a low emissivity glass containing four silver coating layers for automotive and architectural glass as does US 2011/0169402, however there is no specific teaching in US 2011/0169402 regarding the relationship between the thickness of the silver layers and the dielectric layers.

Likewise, in US 2014/0347722, US 2018/0194675 and US 2018/0194676, there is described a coating layer system with three silver layers, however, none of the documents teach the relationship between the silver layers and the dielectric layers specified in the present invention.

However, as sputtered dielectric layers are thicker and slower to deposit than for example sputtered metal layers such as silver, the deposition of complicated layer sequences on a glass substrate often requires a large number of cathodes in a production coating plant.

Previously, the deposition of several complicated coating stacks on a glass substrate has been addressed by installing expensive extensions to a coating line in a glass manufacturing plant, to achieve a sufficient number of cathodes able to deposit coating materials of the required thickness, quantity and order.

This has lead for example to the installation of extra pumping sections in the extensions, to allow the multiple reactive deposition processes to run in sequence. This however, is achieved only at great expense and often with huge disruption, as the coating line usually needs to be stopped for an extended period for the required engineering installations to be completed. Each new cathode and pumping section also requires an accompanying power supply, vacuum pumps, conveyor sections, services, instrumentation and integration into the control system. Such changes often lead to restructuring of the downstream logistics, and possibly even new civil works or building extensions. As the requirement for multiple metal layers and/or more complicated stacks becomes ever more common, these problems are set to increase.

In addition, whilst increasing the number of functional metal layers such as silver in the coating sequence enables the solar protection properties of the coated substrate to be optimized, the increased number of functional metal silver layers negatively impacts the light transmission $T_L$ of the glass substrate.

A further effect of the increasing number of layers in a coated substrate is that it leads to a variation in the outside colour reflection of a coating when viewed at different angles.

Therefore, there exists the need for a coated glass substrate which not only meets the requirements of the glass industry in terms of providing a neutral colouration, and efficient light transparency, but which is also able to provide the required thermal and solar properties.

The aim of the present invention is to therefore provide improved transparent glass substrate, which offer suitable optical properties and thermal properties.

That is, the present invention aims to provide low emissivity (low-e) and/or solar control coated glass substrates which are capable of withstanding ordinary environmental influences during for example, storage, transport and use and which provide the required substantially neutral colouration and optical properties.

It is a further aim of the present invention to provide coated glass substrates with a high selectivity, that is, preferably greater than 2.0 (wherein selectivity=ratio of light transmission and the g-value of a double glazing unit (DGU)) and a low emissivity value, that is, preferably less than 3%, corresponding to a low sheet resistance.

For a double glazing unit (DGU) in a building prepared with coated glass substrates, it is highly desirable for the coated glass to have homogenous colour outside reflection. To achieve this and demonstrate an excellent aesthetic appearance, it is important, that the outside reflection colour variation for the coated glass substrate is minimized when observed at different viewing angles.

Since thickness variations may occur in the production of coated glass substrates, it is extremely important to minimise any colour variations associated with the coating thickness variations, to ensure a homogenous colour appearance of a building façade when a double glazing unit fitted with the coated glass substrate is installed in same.

In summary therefore, the present invention aims to address the problems associated with prior art processes and products as detailed above and seeks to deliver economically efficient and commercially desirable coated glass substrates which meet the required optical properties of the glass industry in terms of for example, haze, light transmittance and importantly colour.

Therefore, according to a first aspect of the present invention there is provided a transparent substrate comprising a multiple layer coating stack, wherein the coating stack comprises:
  i) n functional metal layer, m; and
  ii) n plus 1 (n+1) dielectric layer, d, wherein the dielectric layers are positioned before and after each functional metal layer, and
  wherein n is the total number of functional metal layer in the stack counted from the substrate and is greater than or equal to 3; and
  wherein each dielectric layer comprises one or more layers, characterized in that:
  the geometrical layer thickness of each functional metal layer in the multiple layer coating stack Gm, is greater than the geometrical layer thickness of each functional metal layer appearing before it in the multiple layer coating stack, that is, $$Gm_{i+1} > Gm_i,$$

wherein i is the position of the functional metal layer in the multiple layer coating stack counted from the substrate, and wherein
  for each dielectric layer d located before and after each functional metal layer m, the optical layer thickness of each dielectric layer ($opl_n$) is greater than or equal to the optical layer thickness of the dielectric layer ($opl_{n-1}$) positioned before it in the coating stack with the proviso that:
  twice the optical layer thickness of the first dielectric layer ($opl_1$) in the coating stack, is less than the optical layer thickness of the second dielectric layer ($opl_2$) in the coating stack, that is, $(2 \times opl_1) < opl_2$; and
  twice the optical layer thickness of the last dielectric layer ($opl_{n+1}$) in the coating stack, is greater than the thickness of the optical layer thickness of the penultimate dielectric layer ($opl_n$), that is, $(opl_n) < (opl_{n+1}) \times 2$.

That is for example, in relation to the present invention, when the multiple layer coating stack comprises three silver layers, the optical layer thickness of each dielectric may be expressed as:

$$(2 \times opl_1) < opl_2 \leq opl_n < (opl_{n+1} \times 2),$$

wherein n is 3 and is equal to the number of functional metal silver layers.

When the multiple layer coating stack comprises four silver layers, the optical layer thickness of each dielectric may be expressed as:

$$(2 \times opl_1) < opl_2 \leq opl_3 \leq opl_n < (opl_{n+1} \times 2),$$

wherein n is 4 and is equal to the number of functional metal silver layers.

When the multiple layer coating stack comprises five silver layers, the optical layer thickness of each dielectric may be expressed as:

$$(2 \times opl_1) < opl_2 \leq opl_3 \leq opl_4 \leq opl_n < (opl_{n+1} \times 2).$$

wherein n is 5 and is equal to the number of functional metal silver layers, and, when the multiple layer coating stack comprises six silver layers, the optical layer thickness of each dielectric may be expressed as:

$$(2 \times opl_1) < opl_2 \leq opl_3 \leq opl_4 \leq opl_5 \leq opl_n < (opl_{n+1} \times 2).$$

wherein n is 5 and is equal to the number of functional metal silver layers, so on.

In relation to the first aspect of the present invention the functional metal layer may comprise silver or gold, however, it is preferred that the functional metal layer comprises silver.

The number of functional metal layers in the multiple layer coating stack according to the present invention may preferably comprise from 3 to 6. More preferably the number of functional metal layers in the multiple layer coating stack comprises from 4 to 6. Most preferably however, the number of functional metal layers in the multiple layer coating stack comprises 4.

In relation to the coating stack of the transparent substrate according to the first aspect of the present invention, each dielectric layer may comprises one or more layers of material selected from: TiOx, $SnO_2$, ZnO, ZnO:Al, ZrOx, TiOx, $Nb_2O_5$, $Ta_2O_5$, $In_2O_3$, $Al_2O_3$, $SiO_2$ or alloys or mixtures thereof, such as for example, ZnSnOx, InSnOx; and/or an (oxi)nitride of silicon and/or an (oxi)nitride of aluminium and/or alloys thereof.

Between the functional metallic layer and the subsequent dielectric layer in the coating stack, it is optional to apply an absorbing layer selected from the group comprising one or more of Ni, Cr, W, Nb, Ti, V or alloy and mixtures, for example, NiCr or NiV. The absorbing layer is preferably used to regulate the light and energy transmission of the coating stack. However, in addition, the absorbing layer may also be used as a barrier layer.

It is preferred in relation to the present invention that the coating stack has an angular colour-shift between 0° and 60° for the outside reflection when placed in a double glazing unit (DGU) of $\Delta a^*$, $\Delta b^* \leq 5$. This means that for all viewing angles up to 60°, the colour shift to the 0° view is less than 5 for $a^*$ and $b^*$.

More preferably, the coating stack has an angular colour-shift between 0° and 60° of the outside reflection when placed in a double glazing unit (DGU) of $\Delta b^* \leq 4$. Most preferably, the coating stack has an angular colour-shift between 0° and 60° of the outside reflection when placed in a double glazing unit (DGU) of $\Delta a^*$, $\Delta b^* \leq 3$.

Also, it is preferred in relation to the present invention that the coating stack has a colour shift for the outside reflection when present in a double glazing unit (DGU) with thickness variations of 3% (or more) for one dielectric or metal layer, of less than or equal to 5 for $\Delta a^*$ and less than or equal to 5 for $\Delta b^*$. That is, if one dielectric or metal layer in the coating stack changes target thickness by 3%, the colour shift observed is less than 5 for a* and/or b*.

More preferably, it is preferred in relation to the present invention that the coating stack has a colour shift for the outside reflection when present in a double glazing unit DGU with thickness variations of 3% (or more) for one dielectric or metal layer of less than or equal to 4 for Δa* and less than or equal to 4 for Δb*.

Most preferably, it is preferred in relation to the present invention that the coating stack has a colour shift for the outside reflection when present in a double glazing unit DGU with thickness variations of 3% (or more) for one dielectric or metal layer of less than or equal to 3 for Δa* and less than or equal to 3 for Δb*.

In addition, in relation to the first aspect of the present invention there may be provided a transparent substrate wherein the multiple layer coating stack comprises:
a first dielectric layer, $d_1$;
a first functional metal layer $m_1$;
a second dielectric layer, $d_2$;
a second functional metal layer $m_2$;
a third dielectric layer, $d_3$;
a third functional metal layer $m_3$;
a fourth dielectric layer $d_4$.

In relation to this embodiment of the first aspect of the present invention the first, second and third functional metal layers may each comprise a layer of silver.

Also, in relation to this embodiment of the first aspect of the present invention, the first dielectric layer $d_1$ closest to the glass substrate may comprise in sequence from the glass substrate a layer based on an oxide of titanium (Ti) or alternatively, the first dielectric layer $d_1$ closest to the glass substrate may comprise in sequence from the glass substrate a layer based on an oxide of titanium (Ti) and/or a layer based on an oxide of zinc (Zn).

Further, the second dielectric layer $d_2$ may comprise in sequence from the glass substrate a layer based on an oxide of zinc, and a layer based on an oxide of zinc (Zn) and tin (Sn).

The third dielectric layer $d_3$, preferably may comprise in sequence from the glass substrate a layer based on an oxide of zinc (Zn), and/or a layer based on an oxide of zinc (Zn) and tin (Sn). The third dielectric may also comprise a layer based on an oxide of zirconium (Zr), and/or a layer based on an oxide of titanium. The third dielectric layer may further comprise a layer based on an oxide of zinc located above the layer based on an oxide of titanium.

Between the third metallic layer and the fourth dielectric layer sequence there may also be provided an absorbing layer of NiCr. The layer of NiCr may preferably be provided to adjust the light transmission for the multiple layer coating stack.

Consequently, the multiple layer coating stack may preferably comprise:
a first dielectric layer, $d_1$;
a first functional metal layer $m_1$;
a second dielectric layer, $d_2$;
a second functional metal layer $m_2$;
a third dielectric layer, $d_3$;
a third functional metal layer $m_3$;
an absorbing layer $a_1$; and
a fourth dielectric layer $d_4$.

Further, the fourth dielectric layer may comprise a layer based on an oxide of zinc (Zn), and/or a layer based on an oxide of zinc (Zn) and tin (Sn).

In addition, in relation to the first aspect of the present invention there may be provided a transparent substrate wherein the multiple layer coating stack comprises:
a first dielectric layer, $d_1$;
a first functional metal layer $m_1$;
a second dielectric layer, $d_2$;
a second functional metal layer $m_2$;
a third dielectric layer, $d_3$;
a third functional metal layer $m_3$;
a fourth dielectric layer $d_4$;
a fourth functional metal layer $m_4$; and
a fifth dielectric layer, $d_5$.

In relation to this embodiment of the first aspect of the present invention the first, second and third and fourth functional metal layer may comprise a layer of silver.

Also, the first, second, third and fourth dielectric layers may be as described above and the fifth dielectric layer may comprise a layer based on an oxide of zinc (Zn), and/or a layer based on an oxide of zinc (Zn) and tin (Sn).

Between the third metallic layer and the fourth dielectric layer sequence there may also be provided an absorbing layer of NiCr. The layer of NiCr may preferably be provided to adjust the light transmission for the multiple layer coating stack. Likewise, between the fourth metallic layer and the fifth dielectric layer sequence there may also be provided an absorbing layer of NiCr.

Consequently, the multiple layer coating stack may preferably comprise:
a first dielectric layer, $d_1$;
a first functional metal layer $m_1$;
a second dielectric layer, $d_2$;
a second functional metal layer $m_2$;
a third dielectric layer, $d_3$;
a third functional metal layer $m_3$;
an absorbing layer $a_1$;
a fourth dielectric layer $d_4$;
a fourth functional metal layer $m_4$;
an absorbing layer $a_2$;
a fifth dielectric layer, $d_5$.

Further in relation to the first aspect of the present invention each functional metal layer may comprises a thickness of between 5 and 25 nm. More preferably, each functional metal layer may comprise a thickness of between 6 and 23 nm. Most preferably, each functional metal layer may comprise a thickness of between 8 and 21 nm.

Preferably, in relation to the first aspect of the present invention the first dielectric layer $d_1$ comprises in sequence from the glass substrate; a layer based on an oxide of titanium (Ti), and/or a layer based on an oxide of zinc (Zn).

Also, in relation to the first aspect of the present invention, the second, third, fourth and fifth dielectric layers $d_2$, $d_3$, $d_4$ and $d_5$ may each preferably comprise in sequence from the glass substrate;
i) a layer based on an oxide of zinc (Zn) and/or an absorbing layer based on NiCr; and
ii) a layer based on an oxide of zinc (Zn) and tin (Sn), and/or an oxide of tin (Sn).

An absorbing layer based on NiCr may also be present in the coating stack. The coating stack may preferably be in direct contact with the functional metal layer and may be used in place of the layer based on an oxide of zinc (Zn).

It is preferred also that the third dielectric layer $d_3$, comprises a layer based on an oxide of titanium (Ti).

The fifth dielectric layer $d_5$, may further comprises a layer based on an oxide of zirconium (Zr).

In addition, in relation to the first aspect of the present invention, the optical layer thickness of the first dielectric layer $d_1$, is preferably in the range of the 30 to 70 nm. The optical layer thickness is equal to the product of the refractive index of the material, (measured at a wavelength of 550 nm) and the geometrical layer thickness of the material.

That is, in relation to the first aspect of the present invention, it is preferred that twice the optical layer thickness of the first dielectric layer $d_1$ is less than the optical layer thickness of the second dielectric layer $d_2$, such that, $(2 \times d_1) < d_2$.

The optical layer thickness of the second dielectric layer $d_2$, is preferably in the range 60 to 180 nm. Also, the optical layer thickness of the second dielectric layer $d_2$ is preferably less than or equal to the optical layer thickness of the third dielectric layer $d_3$ that is, $d_2 \le d_3$.

The optical layer thickness of the third dielectric layer $d_3$, is preferably in the range 70 to 200 nm. Also, the optical layer thickness of the third dielectric layer $d_3$ is preferably less than or equal to the optical layer thickness of the fourth dielectric layer $d_4$ that is, $d_3 \le d_4$.

The optical layer thickness of the fourth dielectric layer $d_4$, is preferably in the range 80 to 220 nm. The optical layer thickness of the fifth dielectric layer $d_5$, is preferably in the range 45 to 120 nm.

That is, in relation to the first aspect of the present invention, the optical layer thickness of the fourth dielectric layer $d_4$ is preferably less than twice the optical layer thickness of the fifth dielectric layer $d_5$, that is, $d_4 < (2 \times d_5)$.

According to a second aspect of the present invention there is provided a double glazing unit incorporating a transparent substrate with multiple layer coating stack according to the first aspect of the present invention. It is preferred that all of the features described above in relation to the transparent substrate and multiple layer coating stack according to the first aspect of the present invention also apply to the double glazing unit according to the second aspect of the present invention.

It is preferred that in relation to the first and second aspects of the present invention that the transparent substrate comprises glass, more preferably float glass.

Further in relation to the double glazing unit according to the second aspect of the present invention the double glazing unit may comprise a selectivity of greater than or equal to 1.9. More preferably the selectivity of the glazing unit is greater than or equal to 2.0. Most preferably the selectivity of the glazing unit is greater than or equal 2.1. The selectivity is the ratio of light transmission and the g-value (total energy transmission) of a double glazing unit (DGU). The light transmission and g-value are calculated according to standard EN 410, incorporated herein by reference.

Also, in relation to the double glazing unit according to the second aspect of the present invention, the double glazing unit preferably demonstrates an angular dependence for a* and b* outside reflection from 0° to 60° which comprises less than or equal to 5; more preferably less than or equal to 4.0; and most preferably less than or equal to 3.0.

In addition, it is preferred that the double glazing unit according to the second aspect of the present invention further comprises a colour shift with thickness variation of 3% for one layer of less than or equal to 5; more preferably less than or equal to 4.0; most preferably less than or equal to 3.0.

BRIEF DESCRIPTION OF THE DRAWINGS

Embodiments of the present invention will now be described herein, by way of the non-limiting examples and with reference to FIGS. 1 to 5 in which.

DETAILED DESCRIPTION OF THE INVENTION

Figure 2:
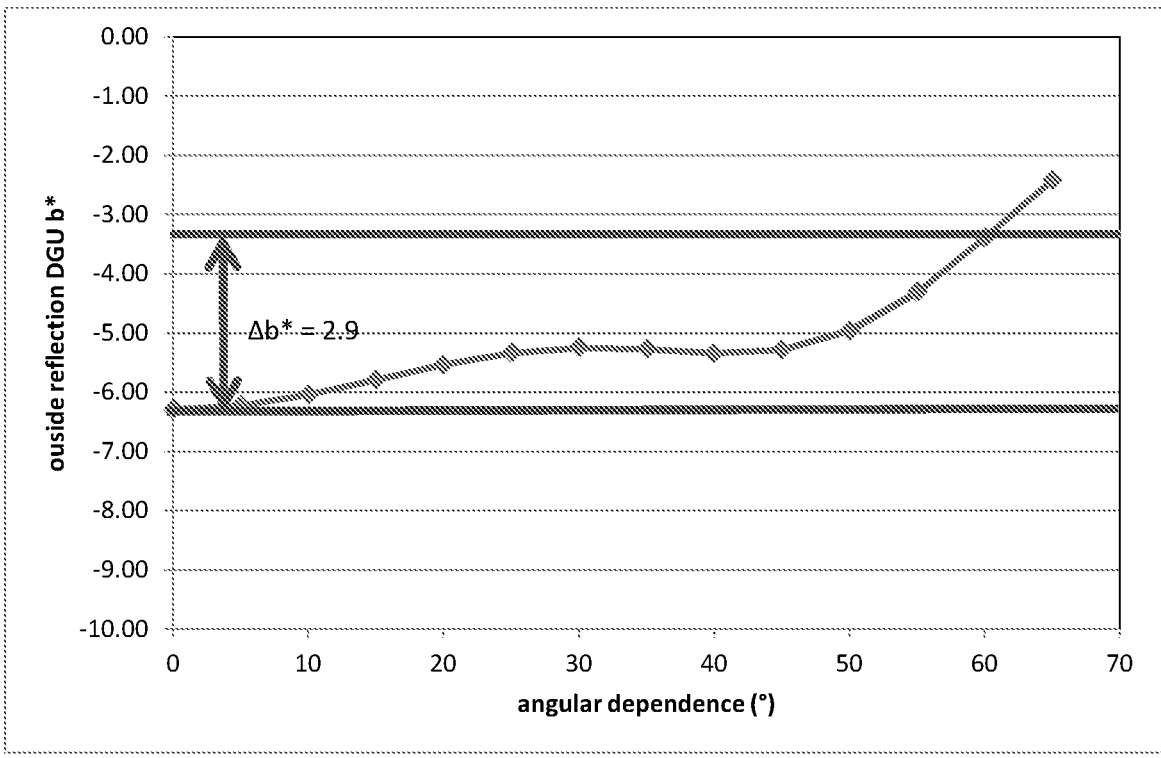
FIG. 2 is a graphical representation of the angular dependence (in degrees) of the outside reflection of a standard double glazing unit (DGU) versus b* and prepared with a coated glass according to example 1.
Figure 3:
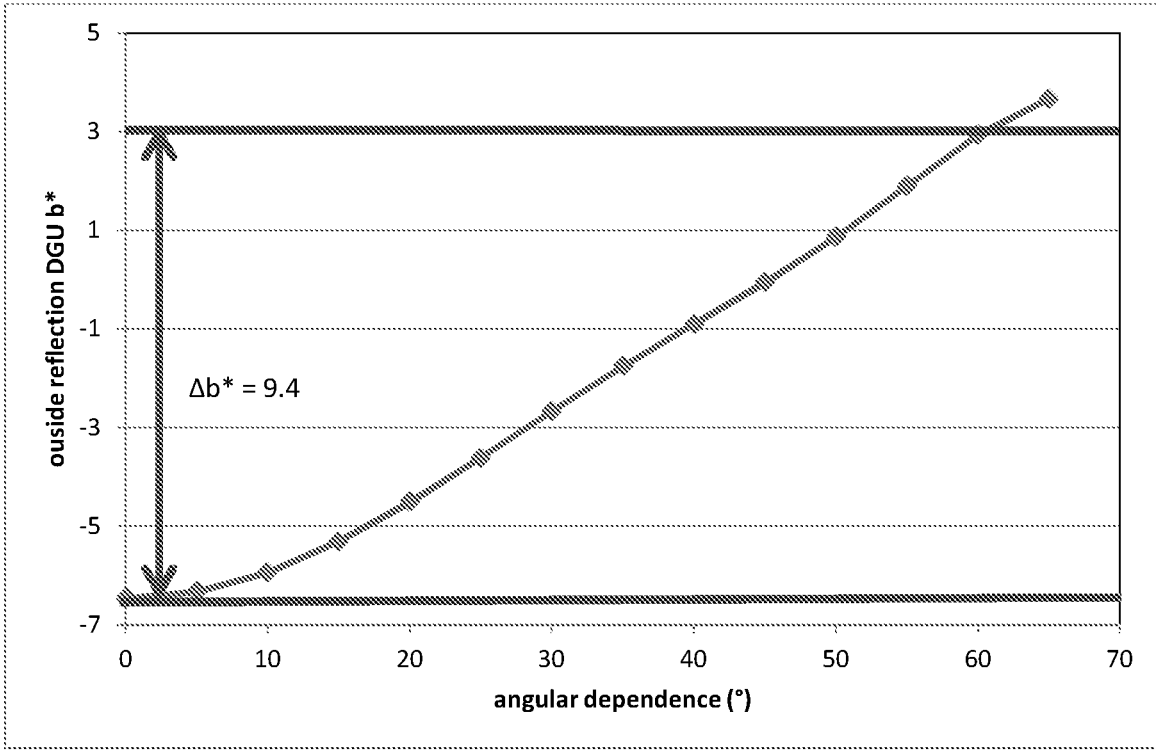
FIG. 3 is a graphical representation of the angular dependence (in degrees) of the outside reflection of a standard double glazing unit (DGU) versus b* prepared with a coated glass according to example 2.
Figure 4:
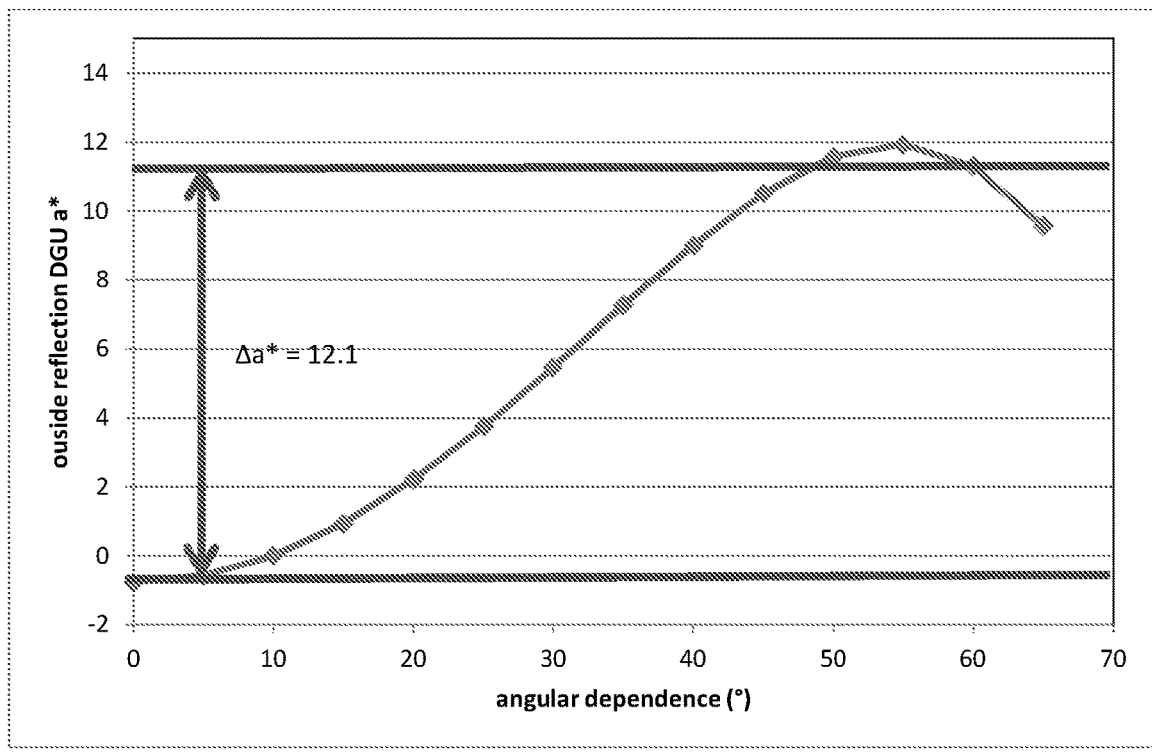
FIG. 4 is a graphical representation of the angular dependence (in degrees) of the outside reflection of a standard double glazing unit (DGU) versus a* prepared with a coated glass according to example 3.
Figure 5:
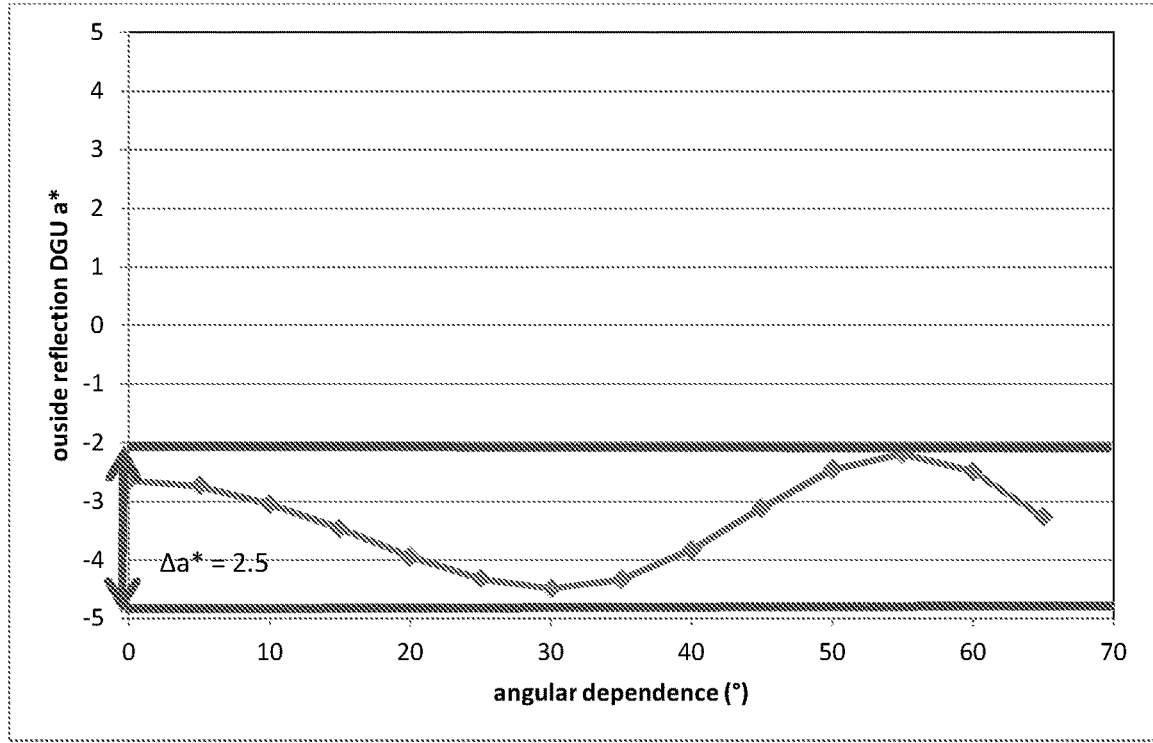
FIG. 5 is a graphical representation of the angular dependence (in degrees) of the outside reflection of a standard double glazing unit (DGU) versus a* prepared with a coated glass according to example 4.

In FIGS. 2 and 3, b* represents the change in colour from blue to yellow according to the CIE LAB colour space, and in FIGS. 4 and 5, a* represents the change in colour from green to red according to the CIE LAB colour space.

For the following examples, details of which are provided in Table 1, the coatings were deposited on 6 mm thick standard float glass pane with a light transmittance in the region of 90% using AC and/or DC magnetron (or pulsed DC) sputtering devices, medium-frequency sputtering being applied where appropriate.

Dielectric layers of an oxide of zinc (Zn) and tin (Sn) were reactively sputtered from zinc-tin targets (weight ratio Zn:Sn approximately 50:50) in an argon/oxygen ($Ar/O_2$) sputter atmosphere.

Titanium oxide (TiOx) layers were deposited from a metallic titanium (Ti) or conductive oxide titanium ($TiO_x$) target in an argon/oxygen ($Ar/O_2$) sputter atmosphere.

The ZnO:Al growth promoting layers were sputtered from Al-doped zinc metallic targets (aluminium (Al) content about 2 weight %) in an $Ar/O_2$ sputter atmosphere.

The functional layers that in all examples consisted of essentially pure silver (Ag) were sputtered from silver targets in an argon (Ar) sputter atmosphere without any added oxygen and at a partial pressure of residual oxygen below $10^{-4}$ mbar.

The barrier layers of Al-doped zinc oxide also referred to as ZAO, located above the silver-based functional layers, were sputtered from conductive oxide targets, $ZnO_x$:Al targets in a pure Argon (Ar) sputter atmosphere without added oxygen.

The layers of NiCr (which may serve as absorbing and/or barrier layers) located directly above the silver-based functional layers, were sputtered from a metallic NiCr-target in a pure Argon sputter atmosphere.

TABLE 1

In the table the geometrical layer thicknesses provided are in nm.

| Layer | Example 1 | Example 2 (Comparative) | Example 3 (Comparative) | Example 4 |
|---|---|---|---|---|
| 1 | $TiO_x$ (19) | $TiO_x$ (33) | $TiO_x$ (22) | $TiO_x$ (22.5) |
| 2 | ZnO:Al (3.5) | | | |
| 3 | Ag (9.3) | Ag (14) | Ag (11.3) | Ag (8.9) |
| 4 | ZAO (2) | ZAO (2) | ZAO (2) | ZAO (2) |
| 5 | $ZnSnO_x$ (66) | $ZnSnO_x$ (73) | $ZnSnO_x$ (80) | $ZnSnO_x$ (66) |
| 6 | Ag (11.5) | Ag (14) | Ag (14.6) | Ag (12) |
| 7 | ZAO (2) | ZAO (2) | ZAO (2) | ZAO (2) |
| 8 | $ZnSnO_x$ (31) | $ZnSnO_x$ (38) | $ZnSnO_x$ (25) | $ZnSnO_x$ (35) |
| 9 | $TiO_x$ (29) | $TiO_x$ (30) | $TiO_x$ (33) | $TiO_x$ (30.5) |
| 10 | ZnO:Al (3.5) | | | |
| 11 | Ag (15.6) | Ag (14) | Ag (15) | Ag (14.5) |
| 12 | ZAO (2) | ZAO (2) | ZAO (2) | NiCr (0.3) |
| 13 | $ZnSnO_x$ (77) | $ZnSnO_x$ (63) | $ZnSnO_x$ (62) | $ZnSnO_x$ (79) |
| 14 | Ag (17.4) | Ag (14) | Ag (15.5) | Ag (16.9) |
| 15 | ZAO (2) | ZAO (2) | ZAO (2) | NiCr (0.8) |
| 16 | $ZnSnO_x$ (41) | $ZnSnO_x$ (37) | $ZnSnO_x$ (17) | $ZnSnO_x$ (41) |
| Substrate thickness | 6 mm | 6 mm | 6 mm | 6 mm |
| Properties | | | | |
| $T_L$ | 59 | 54 | 47 | 50 |
| g-value | 27 | 26 | 22 | 23 |
| Selectivity | 2.18 | 2.07 | 2.13 | 2.17 |
| Δa*, 0°-60° | 1 | 3.9 | 12.1 | 2.2 |
| Δb*, 0°-60° | 2.9 | 9.4 | 1.7 | 2.5 |
| Δa*, 3% | 2.5 | 6.2 | 10.6 | 2.9 |
| Δb*, 3% | 2.8 | 8.0 | 3.2 | 2.3 |

Table 1 provides details of the layer sequences for comparative coated glass panes and coated glass panes according to the present invention along with the results for each layer sequence in terms of:

Light transmission ($T_L$), g-value, Selectivity, colour shift Δa*, Δb* under angular 0°-60° measurement and colour shift Δa*, Δb* for a thickness variation of 3%. All values are for a double glazing unit (DGU). The colour shift is always the shift of the outside reflection. For each example, the layers were deposited onto a 6 mm float glass pane in the sequence shown starting with the layer at the top of each column.

Colour characteristics—the colour characteristics for each sample were measured and reported using the well-established CIE LAB L*, a*, b* coordinates (as described for example in paragraphs [0030] and [0031] of WO 2004/063111A1, incorporated herein by reference).

In the following the examples in which the optical layer thickness of the coating is provided, the optical layer thickness is determined using a refractive index value of 2.45 for TiOx, a refractive index of 2.07 for ZnO:Al, ZAO and a refractive index of 2.07 for ZnSnOx.

Example 1

The coating sequence described in Example 1 was prepared as follows. Onto a 6 mm float glass pane a first titanium oxide ($TiO_x$) layer was applied to form a first dielectric coating sequence with an optical layer thickness $opl_1$ of 46.6 nm. Atop the titanium oxide ($TiO_x$) layer was then applied a layer of aluminium doped zinc oxide (ZnO:Al) with an optical thickness 7.3 nm. Consequently, a first dielectric layer is formed with an optical thickness $opl_1$ of 53.9 nm. Atop the ZnO:Al layer was then applied a first silver functional layer (Ag layer 1) to a coating thickness of 9.3 nm. A barrier layer of aluminium-doped zinc oxide (ZAO) with an optical layer thickness of 4.1 nm was then deposited on the first silver functional layer (Ag layer 1) to protect the first silver functional layer against the subsequent second coating layer sequence of tin and zinc oxide ($ZnSnO_x$) applied with an optical layer thickness of 136.6 nm. Consequently, a second dielectric layer sequence was formed comprising a layer of tin and zinc oxide ($ZnSnO_x$) and aluminium-doped zinc oxide (ZAO) with a combined optical layer thickness $opl_2$ of 140.7 nm. Next a second silver functional layer (Ag layer 2) was applied above the second dielectric layer, with a thickness of 11.5 nm. This was followed again by second barrier layer of aluminium-doped zinc oxide (ZAO) with an optical layer thickness of 4.1 nm applied above the second silver functional layer (Ag layer 2). The second barrier layer of aluminium-doped zinc oxide (ZAO) was then coated with a second dielectric coating layer of tin and zinc oxide ($ZnSnO_x$), with an optical layer thickness of 64.2 nm. A second titanium oxide ($TiO_x$) layer was applied to form a coating with an optical layer thickness of 71.1 nm. A second aluminium doped zinc oxide (ZnO:Al) was coated on the titanium oxide with an optical thickness of 7.3 nm, to complete a third dielectric layer sequence formed from a layer of aluminium-doped zinc oxide (ZAO), a layer of tin and zinc oxide ($ZnSnO_x$), a layer of titanium oxide ($TiO_x$), and an aluminium doped zinc oxide layer (ZnO:Al) comprising an optical layer thickness $opl_3$ of 146.7 nm. Above the third dielectric layer sequence was then applied a third silver functional layer (Ag layer 3) with a thickness of 15.6 nm. Again, a layer of aluminium-doped zinc oxide (ZAO) with an optical layer thickness of 4.1 nm was applied atop the third silver functional layer (Ag layer 3), and above the third layer of aluminium-doped zinc oxide (ZAO) was applied a third layer of tin and zinc oxide ($ZnSnO_x$) with an optical layer thickness of 159.4 nm to form a fourth dielectric layer sequence, with a combined optical layer thickness, $opl_4$ of 163.5 nm. A fourth silver functional layer (Ag layer 4) with a thickness of 17.4 nm was then applied above the third layer of tin and zinc oxide (ZnSnO$_x$). Again, a layer of aluminium-doped zinc oxide (ZAO) with an optical layer thickness of 4.1 nm was deposited above the fourth silver functional layer (Ag layer 4). Finally, a fourth layer of tin and zinc oxide (ZnSnO$_x$) with an optical layer thickness of 82.8 nm was applied above the fourth layer of aluminium-doped zinc oxide (ZAO) to complete the fifth dielectric sequence with a combined optical layer thickness opl$_5$ of 86.9 nm.

The layer sequence for example 1 may therefore be expressed in terms of optical layer thickness and geometric layer thickness for the silver function layers as:

glass/TiO$_x$, opl=46.6 nm/ZnO:Al, opl=7.3 nm/Ag$_1$ 9.3 nm/ZAO, opl=4.1 nm/ZnSnO$_x$, opl=136.6 nm/Ag$_2$ 11.5 nm/ZAO, opl=4.1 nm/ZnSnO$_x$, opl=64.2 nm/TiO$_x$, opl=71.1 nm/ZnO:Al, opl=7.3 nm/Ag$_3$ 15.6 nm/ZAO, opl=4.1 nm/ZnSnO$_x$ 159.4 nm/Ag$_4$ 17.4 nm/ZAO, opl=4.1 nm/ZnSnO$_x$, opl=82.8 nm, The 'opl' values expressed above and in relation to the following examples is the optical layer thickness of a material and is based on the product of the refractive index for the material and the geometrical layer thickness of the material measured at a wavelength of 550 nm.

The optical layer thicknesses for each of the five dielectric layer sequences opl$_1$ to opl$_5$ may be summarized as:
opl$_1$=53.9 nm, opl$_2$=140.7 nm, opl$_3$=146.7 nm, opl$_4$=163.5 nm, opl$_5$=86.9 nm.

In addition, in respect of example 1, the thickness of each silver functional layer dAg increases as the distance of the silver functional layer to the glass substrate increases. That is for example, the thickness of the second silver functional layer dAg$_2$ is greater than the thickness of the first silver functional layer dAg$_1$.

Consequently, in respect of Example 1 and according to the present invention, the following relationships are satisfied:

i) with respect to the thicknesses of the silver functional layers, $$dAg_1 < dAg_2 < dAg_3 < dAg_4;\text{ and}$$

ii) with respect to the thickness of the combined dielectric layer sequences before, after and between each of the silver functional layers, $$(opl_1 \times 2) < opl_2 < opl_3 < opl_4 < (opl_5 \times 2)$$

Figure 1:
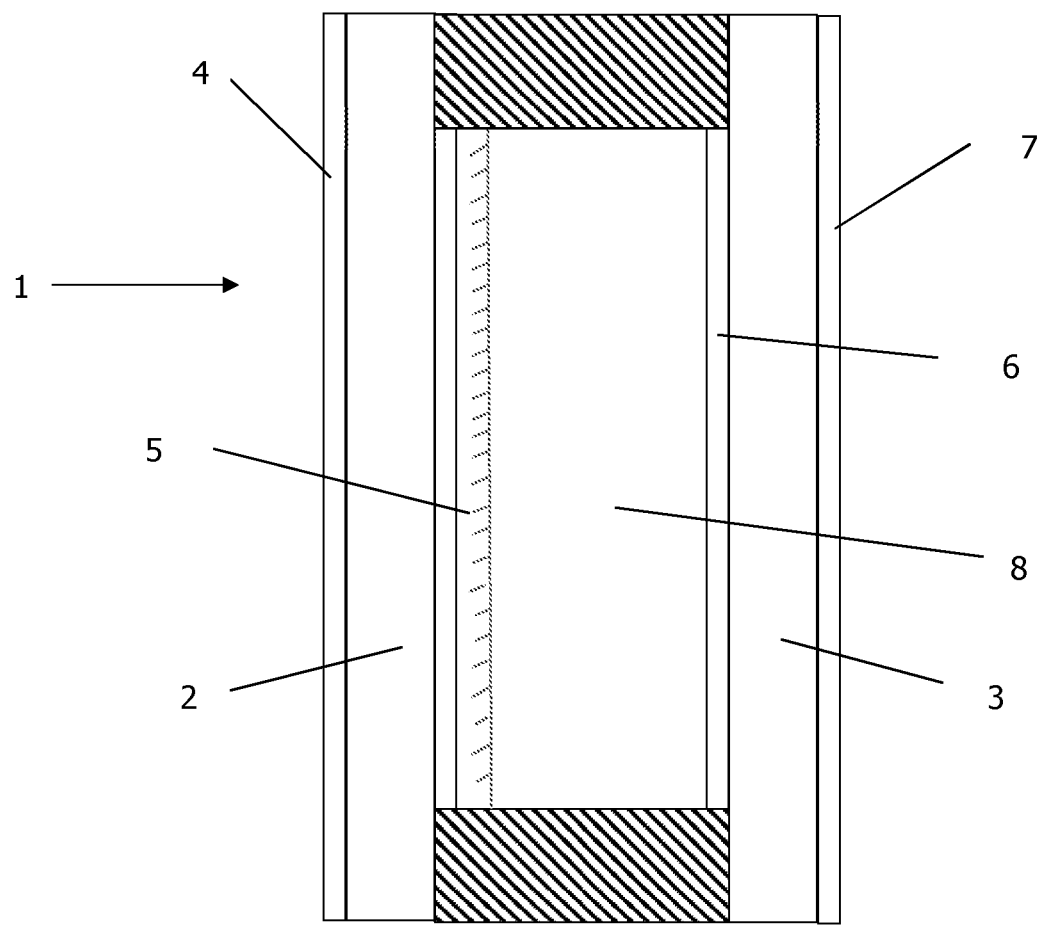
FIG. 1 is a cross section view of a double glazing unit.

A double glazing unit (DGU) (1) as illustrated in FIG. 1 was prepared using a 6 mm glass sheet (2) with a coating (5) as described in example 1. That is, a 6 mm thick float glass sheet (2) with a coating as detailed in example 1 was assembled with a second 4 mm thick uncoated float glass sheet (3). The two sheets of glass (2, 3) were assembled such that the coated side (5) of the coated glass sheet (2) faced the interspace (8) (referred to as position two in the DGU when installed), that is, the coated glass sheet (2) is closer to the external environment (10) than the uncoated glass sheet (3), to form a thermal insulation double-glazing unit. The glass sheets were positioned with an interspace distance of 16 mm between them and, the interspace gap (8) was filled with a 90% argon gas and 10% air filling. The uncoated face (4) of the coated glass sheet (2) was therefore present at position 1, and the two uncoated faces (6) and (7) of the second glass sheet (3) were present at positions 3 and 4 respectively. The properties of the double glazing with the low-e coating at position 2, were measured in accordance with EN 410. The results are as provided in Table 2:

TABLE 2

| Parameter | Measured value |
|---|---|
| Light transmittance (T$_L$) | 59 |
| G-value | 27 |
| Selectivity | 2.18 |
| Δa*, 0°-60° | 1.0 |
| Δb*, 0°-60° | 2.9 |
| Δa*, 3% | 2.5 |
| Δb*, 3% | 2.8 |

In Table 2, the Selectivity value is equal to the ratio of the light transmission and g-value for the double glazing unit, wherein each value is calculated using EN 410 incorporated herein by reference.

The difference in the outside reflection of the DGU prepared with the coating of Example 1 according to the present invention for a view angle of 0° and 60°, in terms of a* and b* was found to be for Δa*=1.0 and Δb*=2.9. A graphical representation of the change in b* versus viewing angle for Example 1 is shown in FIG. 2, indicating that the coating used in example 1 is within required limits.

Also, in relation to the DGU prepared with the coating of Example 1 according to the present invention, the colour shifts with thickness variation of 3% are for Δa*=2.5 and Δb*=2.8. That is, the values for Δa* and Δb* for the DGU prepared using a coating according to the present invention, are within the accepted limit of 5, and are also within the preferred limit of 4, and are even within the especially preferred limit of 3.

Comparative Example 2

The coating sequence described in Example 2 was prepared as follows. Onto a 6 mm float glass pane a first titanium oxide (TiO$_x$) layer was applied to form a first dielectric coating sequence opl$_1$ with an optical layer thickness of 80.9 nm. Atop the titanium oxide (TiO$_x$) layer was then applied a first silver functional layer (Ag layer 1) to a coating thickness of 14 nm. A barrier layer of aluminium-doped zinc oxide (ZAO) with an optical layer thickness of 4.1 nm was then deposited on the first silver functional layer (Ag layer 1) to protect the first silver functional layer against the subsequent second coating layer sequence of tin and zinc oxide (ZnSnO$_x$) applied with an optical layer thickness of 151.1 nm. Consequently, a second dielectric layer sequence was formed comprising a layer of tin and zinc oxide (ZnSnO$_x$) and aluminium-doped zinc oxide (ZAO) with a combined optical layer thickness of 155.2 nm. Next a second silver functional layer (Ag layer 2) was applied above the second dielectric layer, with a thickness of 14 nm. This was followed again by second barrier layer of aluminium-doped zinc oxide (ZAO) with an optical layer thickness of 4.1 nm applied above the second silver functional layer (Ag layer 2). The second barrier layer of aluminium-doped zinc oxide (ZAO) was then coated with a second dielectric coating layer of tin and zinc oxide (ZnSnO$_x$), with an optical layer thickness of 78.7 nm. A second titanium oxide (TiO$_x$) layer was applied to form a coating with an optical layer thickness of 73.5 nm, to complete a third dielectric layer sequence opl$_3$ formed from a layer of aluminium-doped zinc oxide (ZAO), a layer of tin and zinc oxide (ZnSnO$_x$), and a layer of titanium oxide (TiO$_x$) and comprising a combined optical layer thickness of 156.3 nm. Above the third dielectric layer sequence was then applied a third silver functional layer (Ag layer 3) with a thickness of 14 nm. Again, a layer of aluminium-doped zinc oxide (ZAO) with an optical layer thickness of 4.1 nm was applied atop the third silver functional layer (Ag layer 3), and above the third layer of aluminium-doped zinc oxide (ZAO) was applied a third layer of tin and zinc oxide (ZnSnO$_x$) with an optical layer thickness of 130.4 nm to form a fourth dielectric layer sequence, opl$_4$, with a combined optical layer thickness of 134.6 nm. A fourth silver functional layer (Ag layer 4) with a thickness of 14 nm was then applied above the third layer of tin and zinc oxide (ZnSnO$_x$). Again, a layer of aluminium-doped zinc oxide (ZAO) with an optical layer thickness of 4.1 nm was deposited above the coated on the fourth silver functional layer (Ag layer 4). Finally, a fourth layer of tin and zinc oxide (ZnSnO$_x$) with an optical layer thickness of 76.6 nm was applied above the fourth layer of aluminium-doped zinc oxide (ZAO) to complete the fifth dielectric sequence, opl$_5$, with a combined optical layer thickness of 80.7 nm.

The layer sequence for Example 2 may therefore be expressed as:

glass/TiO$_x$, opl=80.9 nm/Ag 14 nm/ZAO, opl=4.1 nm/ZnSnO$_x$, opl=151.2 nm/Ag 14 nm/ZAO, opl=4.1 nm/ZnSnO$_x$, opl=78.7 nm/TiO$_x$, opl=73.5 nm/Ag 14 nm/ZAO, opl=4.1 nm/ZnSnO$_x$ 130.4 nm/Ag 14 nm/ZAO, opl=4.1 nm/ZnSnO$_x$, opl=76.6 nm, The optical layer thicknesses for each of the five dielectric layer sequences opl$_1$ to opl$_5$ in comparative Example 2 may be summarized as:

$opl_1$=80.9 nm, $opl_2$=155.2 nm, $opl_3$=156.3 nm, $opl_4$=134.5 nm, $opl_5$=80.7 nm.

Consequently, for comparative Example 2, the following relationship with respect to the thicknesses of the silver functional layers is not satisfied:

$dAg_1 < dAg_2 < dAg_3 < dAg_4$.

Instead, with respect to the thickness of the silver functional layers for comparative Example 2, the following relationship exists:

$dAg_1 = dAg_2 = dAg_3 = dAg_4$.

That is, the thickness of each silver functional layer is equal for all layers.

Also, with respect to the thickness of the combined dielectric layer sequences before, after and between each of the silver functional layers, for Comparative Example 2, the relationship:

$(opl_1 \times 2) < opl_2 < opl_3 < opl_4 < (opl_5 \times 2)$ is not fulfilled, and instead, twice the optical thickness of the first dielectric layer (opl$_1$× 2) is greater than the optical thickness of second dielectric layer opl$_2$; and the combined optical thickness layer opl$_3$ is greater than the combined optical thickness layer opl$_4$.

Consequently, for Comparative Example 2 the following relationship between the combined optical layer thicknesses exists:

$(opl_1 \times 2) > opl_2 < opl_3 > opl_4 < (opl_5 \times 2)$

A double glazing unit (DGU) (1) as illustrated in FIG. 1 was prepared using a 6 mm glass sheet (2) with a coating (5) as described in comparative Example 2. That is, a 6 mm thick float glass sheet (2) with a coating as detailed in Example 2 was assembled with a second 4 mm thick uncoated float glass sheet (3). The two sheets of glass (2, 3) were assembled such that the coated side (5) of the coated glass (2) sheet faced the interspace (8) (referred to as position two in a DGU when installed), and with the coated glass sheet (2) closer to the external environment (10) than the uncoated glass sheet (3), to form a thermal insulation double-glazing unit. The glass sheets were positioned with an interspace distance of 16 mm between them and the interspace gap (8) was filled with a 90% argon gas and 10% air filling. The uncoated face (4) of the coated glass sheet (2) was therefore present at position 1, and the two uncoated faces (6) and (7) of the second glass sheet (3) were present at positions 3 and 4 respectively. The properties of the double glazing with the low-e coating of comparative Example 2 at position 2, were measured in accordance with EN 410. The results are as provided in Table 3:

TABLE 3

| Parameter | Measured value |
| --- | --- |
| Light transmittance (TL) | 54 |
| G-value | 26 |
| Selectivity | 2.07 |
| Δa*, 0°-60° | 3.9 |
| Δb*, 0°-60° | 9.4 |
| Δa*, 3% | 6.2 |
| Δb*, 3% | 8.0 |

In Table 3, the Selectivity value is equal to the ratio of the light transmission and g-value for the double glazing unit, wherein each value is calculated using EN 410 incorporated herein by reference.

The difference in the outside reflection of the DGU prepared with the coating according to comparative Example 2 for a view angle of 0° and 60°, in terms of a* and b* was found to be for Δa*=3.9 and Δb*=9.4. A graphical representation of the change in b* versus viewing angle for Example 2 is shown in FIG. 3.

Also, in relation to the DGU prepared with the coating of example 2 (not according to the present invention), the colour shifts with thickness variation of 3% are for Δa*=6.2 and Δb*=8.0. That is, the values for Δa* and Δb* for the DGU using the coating detailed in Comparative Example 2 far exceed even the acceptable limit of 5.

Example 3

The coating sequence described in comparative Example 3 was prepared as follows. Onto a 6 mm float glass pane a first titanium oxide (TiO$_x$) layer was applied to form a first dielectric coating sequence with an optical layer thickness opl$_1$ of 53.9 nm. Atop the titanium oxide (TiO$_x$) layer was then applied a first silver functional layer (Ag layer 1) to a coating thickness of 11.3 nm. A barrier layer of aluminium-doped zinc oxide (ZAO) with an optical layer thickness of 4.1 nm was then deposited on the first silver functional layer (Ag layer 1) to protect the first silver functional layer against the subsequent second coating layer sequence of tin and zinc oxide (ZnSnO$_x$) applied with an optical layer thickness of 165.6 nm. Consequently, a second dielectric layer sequence was formed comprising a layer of tin and zinc oxide (ZnSnO$_x$) and a layer of aluminium-doped zinc oxide (ZAO) with a combined optical layer thickness opl$_2$ of 169.7 nm. Next a second silver functional layer (Ag layer 2) was applied above the second dielectric layer, with a thickness of 14.6 nm. This was followed again by second barrier layer of aluminium-doped zinc oxide (ZAO) with an optical layer thickness of 4.1 nm applied above the second silver functional layer (Ag layer 2). The second barrier layer of aluminium-doped zinc oxide (ZAO) was then coated with a second dielectric coating layer of tin and zinc oxide (ZnSnO$_x$), to an optical layer thickness of 51.8 nm. A second titanium oxide (TiO$_x$) layer was applied to form a coating with an optical layer thickness of 80.9 nm, to complete a third dielectric layer sequence formed from a layer of aluminium-doped zinc oxide (ZAO), a layer of tin and zinc oxide (ZnSnO$_x$), and a layer of titanium oxide (TiO$_x$) comprising an optical layer thickness opl$_3$ of 136.8 nm. Above the third dielectric layer sequence was then applied a third silver functional layer (Ag layer 3) with a thickness of 15 nm. Again, a layer of aluminium-doped zinc oxide (ZAO) with an optical layer thickness of 4.1 nm was applied atop the third silver functional layer (Ag layer 3), and above the third layer of aluminium-doped zinc oxide (ZAO) was applied a third layer of tin and zinc oxide (ZnSnO$_x$) with an optical layer thickness of 128.3 nm to form a fourth dielectric layer sequence with a combined optical layer thickness, opl$_4$ of 132.4 nm. A fourth silver functional layer (Ag layer 4) with a thickness of 15.5 nm was then applied above the third layer of tin and zinc oxide (ZnSnO$_x$). Again, a layer of aluminium-doped zinc oxide (ZAO) with an optical layer thickness of 4.1 nm was deposited above the coated on the fourth silver functional layer (Ag layer 4). Finally, a fourth layer of tin and zinc oxide (ZnSnO$_x$) with an optical layer thickness of 31.1 nm was applied above the fourth layer of aluminium-doped zinc oxide (ZAO) to complete the fifth dielectric sequence with a combined optical layer thickness opl$_5$ of 35.2 nm.

The layer sequence for comparative Example 3 may therefore be expressed as:

glass/TiO$_x$, opl=53.9 nm/Ag 11.3 nm/ZAO, opl=4.1 nm/ZnSnO$_x$, opl=165.6 nm/Ag 14.6 nm/ZAO, opl=4.1 nm/ZnSnO$_x$, opl=51.8 nm/TiO$_x$, opl=80.9 nm/Ag 15 nm/ZAO, opl=4.1 nm/ZnSnO$_x$ 128.3 nm/Ag 15.5 nm/ZAO, opl=4.1 nm/ZnSnO$_x$, opl=31.1 nm.

The combined optical layer thicknesses for each of the five dielectric layer sequences opl$_1$ to opl$_5$ may be summarized as:

opl$_1$=53.9 nm, opl$_2$=169.7 nm, opl$_3$=136.8 nm, opl$_4$=132.4 nm, opl$_5$=35.2 nm.

In relation to the silver functional layers, the following relationship exists:

$dAg_1 < dAg_2 < dAg_3 < dAg_4$

However, with respect to the thickness of the combined dielectric layer sequences before, after and between each of the silver functional layers, the relationship observed for Example 1, namely, $(opl_1 \times 2) < opl_2 < opl_3 < opl_4 < (opl_5 \times 2)$ is not fulfilled for comparative Example 3 and instead, the combined optical thickness for the second dielectric sequence layer opl$_2$ is smaller than twice the combined optical thickness layer opl$_1$; the combined optical thickness layer opl$_2$ is greater than the combined optical thickness layer opl$_3$; and the combined optical thickness layer opl$_3$ is greater than the combined optical thickness layer opl$_4$. That is, the following relationship for the combined optical thickness layer thicknesses opl$_1$ to opl$_5$ is observed for comparative Example 3

$(opl_1 \times 2) > opl_2 > opl_3 > opl_4 < (opl_5 \times 2)$

A double glazing unit (DGU) (1) as illustrated in FIG. 1 was prepared using a 6 mm glass sheet (2) with a coating (5) as described in comparative Example 3. That is, a 6 mm thick float glass sheet (2) with a coating as detailed in example 3 was assembled with a second 4 mm thick uncoated float glass sheet (3). The two sheets of glass (2, 3) were assembled such that the coated side (5) of the coated glass sheet (3) faced the interspace (8) (referred to as position two in a DGU when installed), that is, the coated glass sheet (5) is closer to the external environment (10) than the uncoated glass sheet (3) to form a thermal insulation double-glazing unit. The glass sheets were positioned with an interspace distance of 16 mm between them and the interspace gap (8) was filled with a 90% argon gas and 10% air filling. The uncoated face (4) of the coated glass sheet (2) was therefore present at position 1, and the two uncoated faces (6) and (7) of the second glass sheet (3) were present at positions 3 and 4 respectively. The properties of the double glazing with the low-e coating from comparative Example 3 at position 2, were measured in accordance with EN 410. The results are as provided in Table 4:

TABLE 4

| Parameter | Measured value |
| --- | --- |
| Light transmittance (TL) | 47 |
| G-value | 22 |
| Selectivity | 2.13 |
| Δa*, 0°-60° | 12.1 |
| Δb*, 0°-60° | 1.7 |
| Δa*, 3% | 10.6 |
| Δb*, 3% | 3.2 |

In Table 4, the Selectivity value is equal to the ratio of the light transmission and g-value for the double glazing unit, wherein each value is calculated using EN 410 incorporated herein by reference.

The difference in the outside reflection of the DGU prepared with the coating according to comparative Example 3 for a view angle of 0° and 60°, in terms of a* and b* was found to be for Δa*=12.1 and Δb*=1.7. A graphical representation of the change in a* versus viewing angle for Example 3 is shown in FIG. 4.

Also, in relation to the DGU prepared with the coating of example 3, the colour shifts with thickness variation of 3% are for Δa*=10.6 and Δb*=3.2.

That is, the values for Δa* for the DGU using the coating detailed in Comparative Example 3 far exceed even the acceptable limit of 5.

Example 4

The coating sequence described in Example 4 was prepared as follows. Onto a 6 mm float glass pane a first titanium oxide (TiO$_x$) layer was applied to form a first dielectric coating sequence with an optical layer thickness opl$_1$ of 55.1 nm. Atop the titanium oxide (TiO$_x$) layer was then applied a first silver functional layer (Ag layer 1) to a coating thickness of 8.9 nm. A barrier layer of aluminium-doped zinc oxide (ZAO) with an optical layer thickness of 4.1 nm was then deposited on the first silver functional layer (Ag layer 1) to protect the first silver functional layer against the subsequent second coating layer sequence of tin and zinc oxide (ZnSnO$_x$) applied with an optical layer thickness of 132.5 nm. Consequently, a second dielectric layer sequence was formed comprising a layer of tin and zinc oxide (ZnSnO$_x$) and aluminium-doped zinc oxide (ZAO) with a combined optical layer thickness opl$_2$ of 136.6 nm. Next a second silver functional layer (Ag layer 2) was applied above the second dielectric layer, with a thickness of 12 nm. This was followed again by further barrier layer of aluminium-doped zinc oxide (ZAO) with an optical layer thickness of 4.1 nm applied above the second silver functional layer (Ag layer 2). The layer of aluminium-doped zinc oxide (ZAO) was then coated with a layer of tin and zinc oxide (ZnSnO$_x$), to thickness of 68.3 nm. A layer of titanium oxide (TiO$_x$) of thickness 74.7 nm was then applied to form a third dielectric layer sequence opl$_3$ with a combined optical layer thickness of 147.1 nm. Above the third dielectric layer sequence was then applied a third silver functional layer (Ag layer 3) with a thickness of 14.5 nm. On the layer of silver was then applied an absorbing layer of nickel chromium of thickness 0.3 nm, to reduce the transmission of the coating. Above the NiCr-layer a third layer of tin and zinc oxide (ZnSnO$_x$) with an optical layer thickness of 163.5 nm to form a fourth dielectric layer sequence with a combined effective optical layer thickness, opl$_4$ of 163.5 nm. A fourth silver functional layer (Ag layer 4) with a thickness of 16.9 nm was then applied above the third layer of tin and zinc oxide (ZnSnO$_x$). Again, a layer of nickel chromium with an optical layer thickness of 0.8 nm was then applied above the fourth silver layer. Finally, a fourth layer of tin and zinc oxide (ZnSnO$_x$) with an optical layer thickness of 84.9 nm was applied to complete the fifth dielectric sequence with a combined effective optical layer thickness opl$_5$ of 86.9 nm.

The layer sequence for example 1 may therefore be expressed in terms of optical layer thickness and geometric layer thickness for the silver function layers as:

glass/TiO$_x$, opl=55.1 nm/Ag 8.9 nm/ZAO, opl=4.1 nm/ZnSnO$_x$, opl=132.5 nm/Ag 12 nm/ZAO, opl=4.1 nm/ZnSnO$_x$, opl=68.3 nm/TiO$_x$, opl=74.7 nm/Ag 14.5 nm/NiCr 0.3 nm/ZnSnO$_x$ 163.5 nm/Ag 16.9 nm/NiCr 0.8 nm/ZnSnO$_x$, opl=84.9 nm.

The optical layer thicknesses for each of the five dielectric layer sequences opl$_1$ to opl$_5$ may be summarized as:

$opl_1$=55.1 nm, $opl_2$=136.6 nm, $opl_3$=147.1 nm, $opl_4$=163.5 nm, $opl_5$=84.9 nm.

In addition, in respect of Example 4, the thickness of each silver functional layer dAg increases as the distance of the silver functional layer to the glass substrate increases. That is for example, the thickness of the second silver functional layer dAg$_2$ is greater than the thickness of the first silver functional layer dAg$_1$.

Consequently, in respect of Example 4 according to the present invention, the following relationships are satisfied:
i) with respect to the thicknesses of the silver functional layers, $dAg_1 < dAg_2 < dAg_3 < dAg_4$; and ii) with respect to the thickness of the combined dielectric layer sequences before, after and between each of the silver functional layers, $(opl_1 \times 2) < opl_2 < opl_3 < opl_4 < (opl_5 \times 2)$ A double glazing unit (DGU) (1) as illustrated in FIG. 1 was prepared using a 6 mm glass sheet (2) with a coating (5) as described in Example 4. That is, a 6 mm thick float glass sheet (2) with a coating as detailed in Example 4 was assembled with a second 4 mm thick uncoated float glass sheet (3). The two sheets of glass (2, 3) were assembled such that the coated side (5) of the coated glass sheet (3) faced the interspace (8) (referred to as position two in a DGU when installed), that is, the coated glass sheet (5) is closer to the external environment (10) than the uncoated glass sheet (3) to form a thermal insulation double-glazing unit. The glass sheets were positioned with an interspace distance of 16 mm between them and the interspace gap (8) was filled with a 90% argon gas and 10% air filling. The uncoated face (4) of the coated glass sheet (2) is therefore present at position 1, and the two uncoated faces (6) and (7) of the second glass sheet (3) are present at positions 3 and 4 respectively. The properties of the double glazing with the low-e coating at position 2, were measured in accordance with EN 410. The results are as provided in Table 5:

TABLE 5

| Parameter | Measured value |
|---|---|
| Light transmittance (T$_L$) | 50 |
| G-value | 23 |
| Selectivity | 2.17 |
| Δa*, 0°-60° | 2.2 |
| Δb*, 0°-60° | 2.5 |
| Δa*, 3% | 2.9 |
| Δb*, 3% | 2.3 |

In Table 5, the Selectivity value is equal to the ratio of the light transmission and G-value for a double glazing unit, wherein each value is calculated using EN 410 incorporated herein by reference.

The difference in the outside reflection of the DGU prepared with the coating according to comparative Example 4 for a view angle of 0° and 60°, in terms of a* and b* was found to be for Δa*=2.2 and Δb*=2.5. A graphical representation of the change in a* versus viewing angle for Example 4 is shown in FIG. 5.

Also, in relation to the DGU prepared with the coating of Example 4, the colour shifts with thickness variation of 3% are for Δa*=2.9 and Δb*=2.3. That is, the values for Δa* and Δb* for the DGU prepared using the coating of Example 4, according to the present invention, are within the accepted limit of 5, and are also within the preferred limit of 4, and are even within the especially preferred limit of 3.

Summary of Results

Therefore, it can be seen from the above results that the coated glass sheets prepared according to the present invention (that is, Examples 1 and 4) provide good solar control performance with a high selectivity 2.18 and 2.17. Also, both of Examples 1 and 4 show a small variation of the outside colour under different viewing angle when placed in a façade. For both examples, the colour change under different viewing angle when placed in a double glazing unit is as preferred, with a value of less than 3.0 for Δa* and Δb*.

In terms of the production of double glazing units (DGUs), it is an important advantage associated with the present invention of being able to offer DGU's which demonstrate a low change in colour as the thickness of the coating layer changes. For both of Examples 1 and 4, there was a change of less than 3 for both Δa* and Δb*, for a thickness variation in the fourth dielectric layer of the coating stack sequence of 3%.

In contrast, in comparative Example 2, were all of the silver layers are of the same thickness, and also, the optical thickness relationship for each of the dielectric layers required of the present invention is not fulfilled, the selectivity is 2.07, and the colour shift for the coated substrate under different viewing angles (0°-60°) when formed into a DGU is above 5 for b*, and actually Δb*=9.4. The colour change with a thickness variation of 3% for the second dielectric layer of Example 2 is also above 5, with values of Δa*=6.2 and Δb*=8.0 respectively.

In comparative Example 3, the required optical thickness relationship for the dielectric layers according to the present invention is again not fulfilled. Instead, the optical layer thicknesses for the dielectric layers in Example 3 decrease instead of increasing, as one moves away from the glass substrate. In addition, the selectivity is 2.13, and the colour shift under different viewing angles (0°-60°) for the DGU formed with a coated glass according to Example 3, is above 5 for a*, and actually, Δa*=12.1. Finally, the colour change recorded with a thickness variation of 3% for the fourth dielectric layer in Example 3 for a* is also above 5, with a value for Δa*=10.6.

The invention claimed is:

1. A transparent substrate comprising a multiple layer coating stack, wherein the coating stack comprises:
   i) n functional metal layers comprising silver, m; and
   ii) n plus 1 (n+1) dielectric layers, d, wherein the dielectric layers are positioned before and after each functional metal layer, and
   wherein n is the total number of functional metal layers in the stack counted from the substrate and is an integer greater than or equal to 4; and
   wherein each dielectric layer comprises one or more layers, characterized in that:
   the geometrical layer thickness of each functional metal layer in the multiple layer coating stack Gm, is greater than the geometrical layer thickness of each functional metal layer appearing before it in the multiple layer coating stack, that is, $Gm_{i+1} > Gm_i$,
   wherein i is the position of the functional metal layer in the multiple layer coating stack counted from the substrate, and wherein:
   the optical layer thickness of each dielectric layer located between a pair of functional metal layers is greater than or equal to the optical layer thickness of the dielectric layer positioned before it in the coating stack;
   twice the optical layer thickness of the first dielectric layer ($opl_1$) in the coating stack, is less than the optical layer thickness of the second dielectric layer ($opl_2$) in the coating stack, that is, $2 \times opl_1 < opl_2$; and
   the optical layer thickness of the last dielectric layer ($opl_{n+1}$) in the coating stack is less than the optical layer thickness of the penultimate dielectric layer ($opl_n$) and twice the optical layer thickness of the last dielectric layer ($opl_{n+1}$) in the coating stack, is greater than the thickness of the optical layer thickness of the penultimate dielectric layer ($opl_n$), that is, $opl_{n+1} < opl_n$ and $opl_n < opl_{n+1} \times 2$.

2. The transparent substrate according to claim 1, wherein the number of functional metal layers n in the multiple layer coating stack is 4 to 6.

3. The transparent substrate according to claim 1, wherein the number of functional metal layers in the multiple layer coating stack is 4.

4. The transparent substrate according to claim 1, wherein each dielectric layer comprises one or more layers of material selected from:
   $TiOx$, $SnO_2$, $ZnO$, $ZAO$, $ZnO:Al$, $ZrOx$, $TiOx$, $Nb_2O_5$, $Ta_2O_5$, $In_2O_3$, $Al_2O_3$, $SiO_2$ or alloys or mixtures thereof, including $ZnSnOx$, $InSnOx$, and/or an (oxi)nitride of silicon and/or an (oxi)nitride of aluminium and/or alloys thereof.

5. The transparent substrate according to claim 1, wherein the transparent substrate comprises a glass substrate and the multiple layer coating stack comprises in sequence from the glass substrate:
   a first dielectric layer, $d_1$;
   a first functional metal layer $m_1$;
   a second dielectric layer, $d_2$;
   a second functional metal layer $m_2$;
   a third dielectric layer, $d_3$;
   a third functional metal layer $m_3$;
   a fourth dielectric layer $d_4$.

6. The transparent substrate according to claim 1, wherein the transparent substrate comprises a glass substrate and the multiple layer coating stack comprises in sequence from the glass substrate:
   a first dielectric layer, $d_1$;
   a first functional metal layer $m_1$;
   a second dielectric layer, $d_2$;
   a second functional metal layer $m_2$;
   a third dielectric layer, $d_3$;
   a third functional metal layer $m_3$;
   a fourth dielectric layer $d_4$;
   a fourth functional metal layer $m_4$;
   a fifth dielectric layer, $d_5$.

7. The transparent substrate according to claim 1, wherein each functional metal layer comprises a thickness of between 5 and 25 nm.

8. The transparent substrate according to claim 5, wherein the first dielectric layer $d_1$ comprises in sequence from the glass substrate; a layer based on an oxide of titanium (Ti), and/or a layer based on an oxide of zinc (Zn).

9. The transparent substrate according to claim 5, wherein the second, third, fourth and fifth dielectric layers $d_2$, $d_3$, $d_4$ and $d_5$ each comprise in sequence from the glass substrate;
   i) a layer based on an oxide of zinc (Zn); and
   ii) a layer based on an oxide of zinc (Zn) and tin (Sn), and/or an oxide of tin (Sn).

10. The transparent substrate according to claim 9, wherein the third dielectric layer $d_3$, further comprises a layer based on an oxide of titanium (Ti).

11. The transparent substrate according to claim 6, wherein the fifth dielectric layer $d_5$, further comprises a layer based on an oxide of zirconium (Zr).

12. The transparent substrate according to claim 5, wherein the optical layer thickness of the first dielectric layer $d_1$, is the range 30-70 nm.

13. The transparent substrate according to claim 5, wherein the optical layer thickness of the second dielectric layer $d_2$, is the range 60-180 nm.

14. The transparent substrate according to claim 5, wherein the optical layer thickness of the third dielectric layer $d_3$, is the range 70-200 nm.

15. The transparent substrate according to claim 5, wherein the optical layer thickness of the fourth dielectric layer $d_4$, is the range 80-220 nm.

16. The transparent substrate according to claim 6, wherein the optical layer thickness of the fifth dielectric layer $d_5$, is the range 45-120.

17. The transparent substrate according to claim 5, wherein the coating stack further comprises one or more layer based on NiCr.

18. The transparent substrate according to claim 17, wherein the or each layer based on NiCr is in direct contact with one silver functional layer.

19. A transparent substrate comprising a multiple layer coating stack, wherein the coating stack comprises:
   i) n functional metal layers comprising silver, m; and
   ii) n plus 1 (n+1) dielectric layers, d, wherein the dielectric layers are positioned before and after each functional metal layer, and
   wherein n is the total number of functional metal layers in the stack counted from the substrate and is equal to 5; and
   wherein each dielectric layer comprises one or more layers, characterized in that:

the geometrical layer thickness of each functional metal layer in the multiple layer coating stack Gm, is greater than the geometrical layer thickness of each functional metal layer appearing before it in the multiple layer coating stack, that is, $Gm_{i+1} > Gm_i$, wherein i is the position of the functional metal layer in the multiple layer coating stack counted from the substrate, and wherein:

the optical layer thickness of each dielectric layer located between a pair of functional metal layers is greater than or equal to the optical layer thickness of the dielectric layer positioned before it in the coating stack;

twice the optical layer thickness of the first dielectric layer ($opl_1$) in the coating stack is less than the optical layer thickness of the second dielectric layer ($opl_2$) in the coating stack, that is, $2 \times opl_1 < opl_2$; and the optical layer thickness of the last dielectric layer ($opl_{n+1}$) in the coating stack is less than the optical layer thickness of the penultimate dielectric layer ($opl_n$) and twice the optical layer thickness of the last dielectric layer ($opl_{n+1}$) in the coating stack is greater than the thickness of the optical layer thickness of the penultimate dielectric layer ($opl_n$), that is, $opl_{n+1} < opl_n$ and $opl_n < opl_{n+1} \times 2$, such that $(opl_1 \times 2) < opl_2 \leq opl3 \leq opl_4 < opl_5 < (opl_6 \times 2)$ and $opl_6 < opl_5$.

20. A double glazing unit incorporating a transparent substrate with a multiple layer coating stack according to claim 1.

21. The double glazing unit according to claim 20, wherein the angular dependence for a* and b* outside reflection from 0° to 60° comprises less than or equal to 5; more preferably less than or equal to 4.0; most preferably less than or equal to 3.0.

22. The double glazing unit according to claim 20, further comprising a colour shift with thickness variation of 3% for one layer of less than or equal to 5;
   more preferably less than or equal to 4.0; most preferably less than or equal to 3.0.

23. The double glazing unit according to claim 20, further comprising a selectivity of greater than or equal to 1.9, more preferably greater than or equal to 2.0, and most preferably greater than or equal 2.1.

* * * * *